(12) United States Patent
Matsuyama

(10) Patent No.: US 9,768,100 B1
(45) Date of Patent: Sep. 19, 2017

(54) SEMICONDUCTOR DEVICE

(71) Applicant: KABUSHIKI KAISHA TOSHIBA, Tokyo (JP)

(72) Inventor: Hiroshi Matsuyama, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/245,924

(22) Filed: Aug. 24, 2016

(30) Foreign Application Priority Data

Mar. 7, 2016 (JP) .................. 2016-043303

(51) Int. Cl.
*H01L 23/495* (2006.01)
*H01L 23/498* (2006.01)
*H01L 25/18* (2006.01)
*H01L 23/00* (2006.01)
*H01L 23/367* (2006.01)

(52) U.S. Cl.
CPC .... *H01L 23/49541* (2013.01); *H01L 23/3672* (2013.01); *H01L 23/495* (2013.01);
(Continued)

(58) Field of Classification Search
CPC ......... H01L 24/01; H01L 24/07; H01L 24/08; H01L 24/09; H01L 24/26; H01L 24/28; H01L 24/29; H01L 24/30; H01L 24/34; H01L 24/36; H01L 24/37; H01L 24/38; H01L 24/39; H01L 24/41; H01L 24/46;
(Continued)

(56) References Cited

U.S. PATENT DOCUMENTS 7,756,494 B2   7/2010 Fujioka et al.
2002/0084516 A1*  7/2002 Efland .............. H01L 23/5286
                                                    257/666

(Continued)

FOREIGN PATENT DOCUMENTS

JP   H05235258 A   9/1993
JP   2003257988 A  9/2003
(Continued)

OTHER PUBLICATIONS

R. Siemieniec et al., Avoidance of RF plasma extraction transit-time oscillations using 3-D EMC simulation: chances and limits, IEE Proc.-Circuits Devices Syst., vol. 153, No. 1, Feb. 2006, pp. 16-22.

*Primary Examiner* — Eduardo A Rodela
(74) *Attorney, Agent, or Firm* — Patterson & Sheridan, LLP

(57) ABSTRACT

A semiconductor device includes a first conductive layer with first and second sections separated in a first direction. A first chip is on the first section and has a first, second and third electrodes. A second chip is on the second section and has a fourth and fifth electrode. A second conductive layer is between the sections of the first conductive layer in the first direction. The second conductive layer has a first connected section to which the second electrode is connected, a second connected section to which to the fifth electrode is connected, and a first clearance portion between the first and second connected sections in the first direction. A third conductive layer is spaced from the first conductive layer and the second conductive layer and is connected to the third electrode.

20 Claims, 10 Drawing Sheets

(52) U.S. Cl.
CPC .. *H01L 23/49503* (2013.01); *H01L 23/49844* (2013.01); *H01L 24/01* (2013.01); *H01L 24/09* (2013.01); *H01L 24/32* (2013.01); *H01L 24/48* (2013.01); *H01L 24/73* (2013.01); *H01L 25/18* (2013.01); *H01L 2224/32157* (2013.01); *H01L 2224/48159* (2013.01); *H01L 2224/73265* (2013.01); *H01L 2924/30105* (2013.01); *H01L 2924/30107* (2013.01)

(58) Field of Classification Search
CPC ....... H01L 24/47; H01L 23/02; H01L 23/043; H01L 23/047; H01L 23/051; H01L 23/14; H01L 23/142; H01L 23/492; H01L 23/495; H01L 23/49503; H01L 23/4951; H01L 23/49513; H01L 23/4952; H01L 23/49534; H01L 23/49537; H01L 23/49541; H01L 23/49575; H01L 23/498; H01L 23/49811; H01L 23/49838; H01L 23/49861; H01L 23/528; H01L 23/5286; H01L 23/538; H01L 23/5386
See application file for complete search history.

(56) References Cited

U.S. PATENT DOCUMENTS

| | | | |
|---|---|---|---|
| 2003/0062601 A1* | 4/2003 | Harnden | H01L 23/3107 257/666 |
| 2010/0019391 A1* | 1/2010 | Strzalkowski | H01L 23/495 257/777 |
| 2015/0115313 A1* | 4/2015 | Otremba | H01L 23/49503 257/124 |
| 2015/0155228 A1* | 6/2015 | Ikeda | H01L 23/49575 257/140 |
| 2015/0206830 A1* | 7/2015 | Takada | H01L 23/49562 257/676 |
| 2016/0163615 A1* | 6/2016 | Mitamura | H01L 27/0664 257/140 |

FOREIGN PATENT DOCUMENTS

| | | |
|---|---|---|
| JP | 2004200393 A | 7/2004 |
| JP | 2008035487 A | 2/2008 |
| JP | 5164136 B2 | 3/2013 |

* cited by examiner

FIG. 6
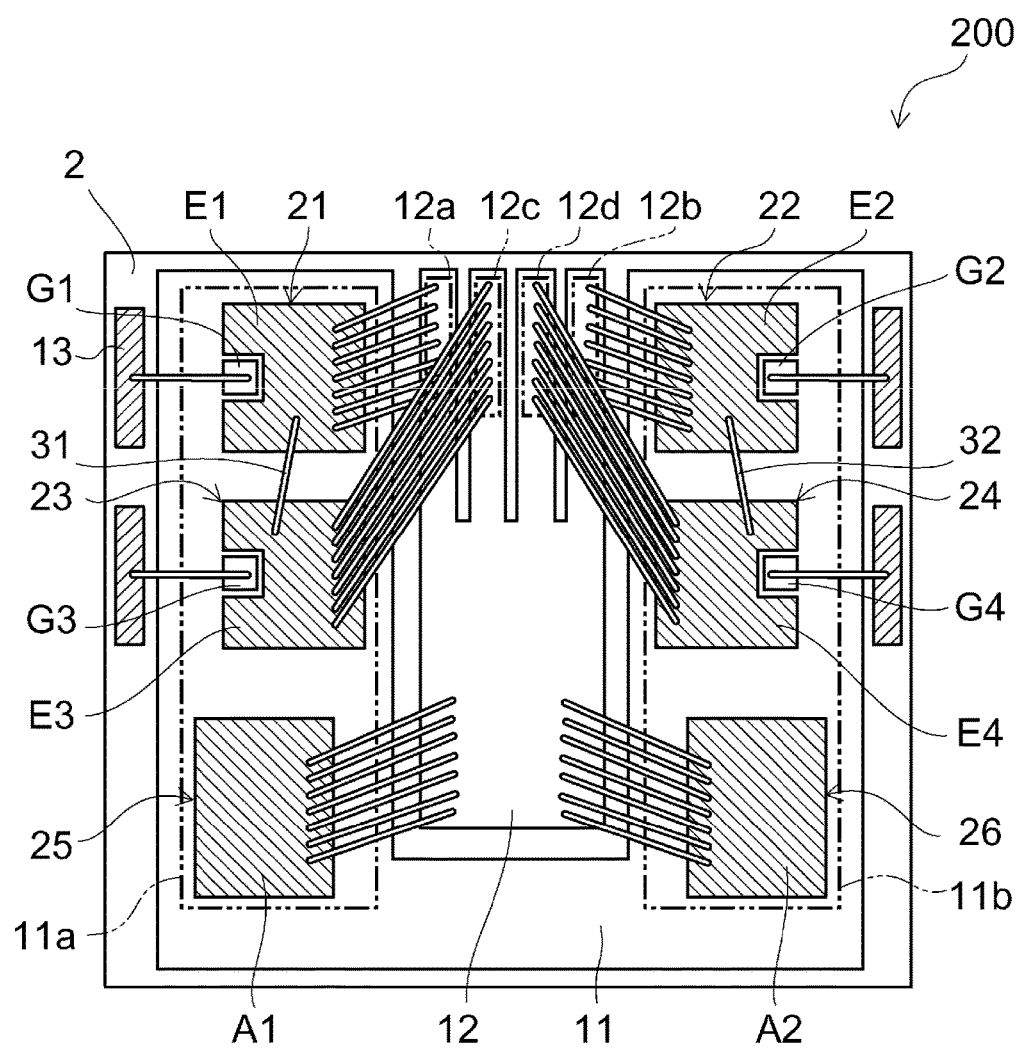
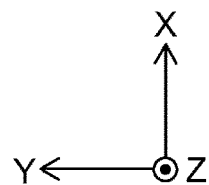

FIG. 7
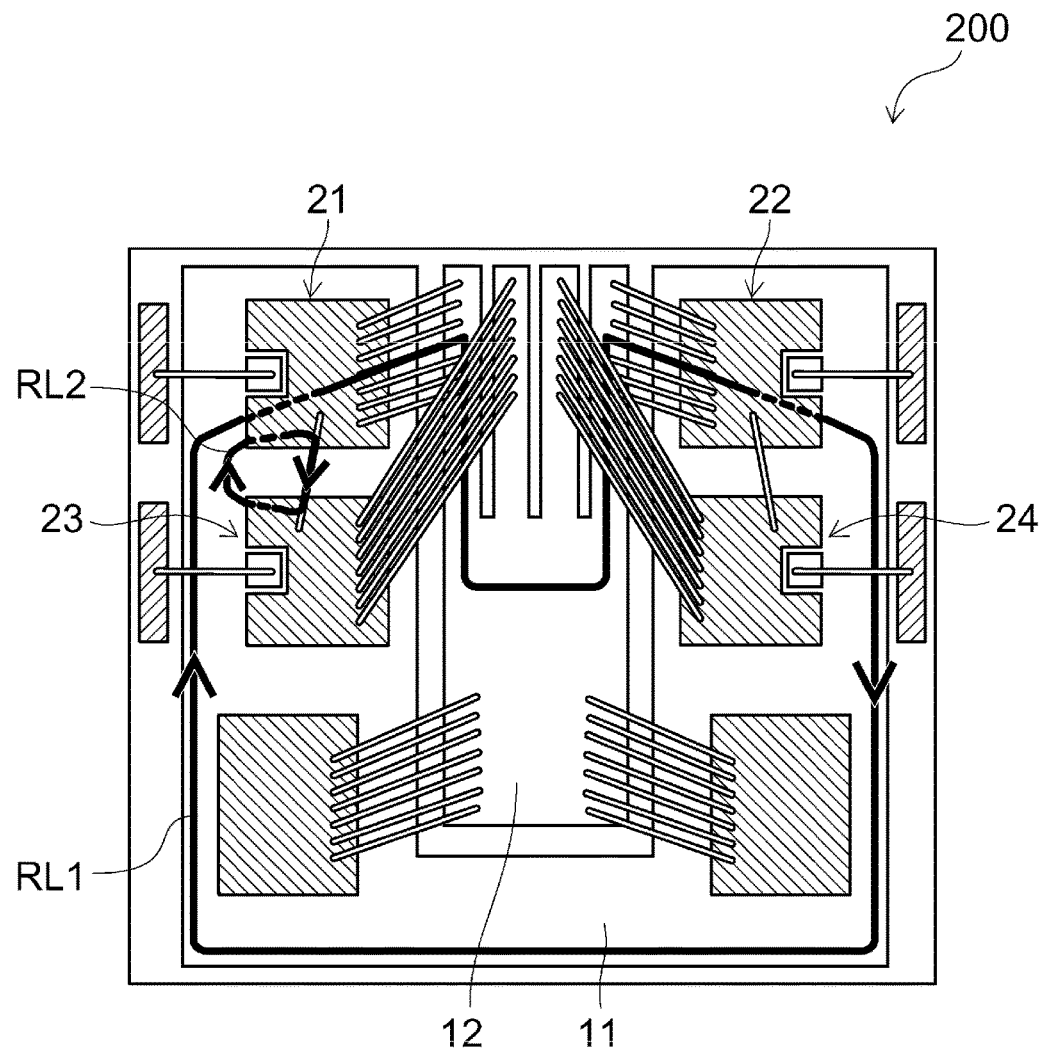
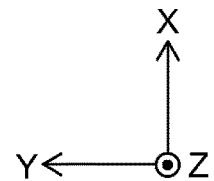

SEMICONDUCTOR DEVICE

CROSS-REFERENCE TO RELATED APPLICATION

This application is based upon and claims the benefit of priority from Japanese Patent Application No. 2016-043303, filed Mar. 7, 2016, the entire contents of which are incorporated herein by reference.

FIELD

Embodiments described herein relate generally to a semiconductor device.

BACKGROUND

In a semiconductor device including a semiconductor chip having a switching function, noise occurs during switching. If a resonance frequency of a resonance loop formed in the semiconductor device matches a frequency of the noise, the noise will be amplified. If the noise is amplified, there is a possibility that failures will occur. For example, the semiconductor device may be brought inadvertently into an on state when the semiconductor device is intended to be in an off state and the semiconductor device will not operate properly.

DESCRIPTION OF THE DRAWINGS

FIG. 6 is an enlarged plan view illustrating a portion of a semiconductor device according to a second embodiment.

FIG. 7 is an enlarged plan view illustrating a portion of the semiconductor device according to the second embodiment.

DETAILED DESCRIPTION

Figure 1:
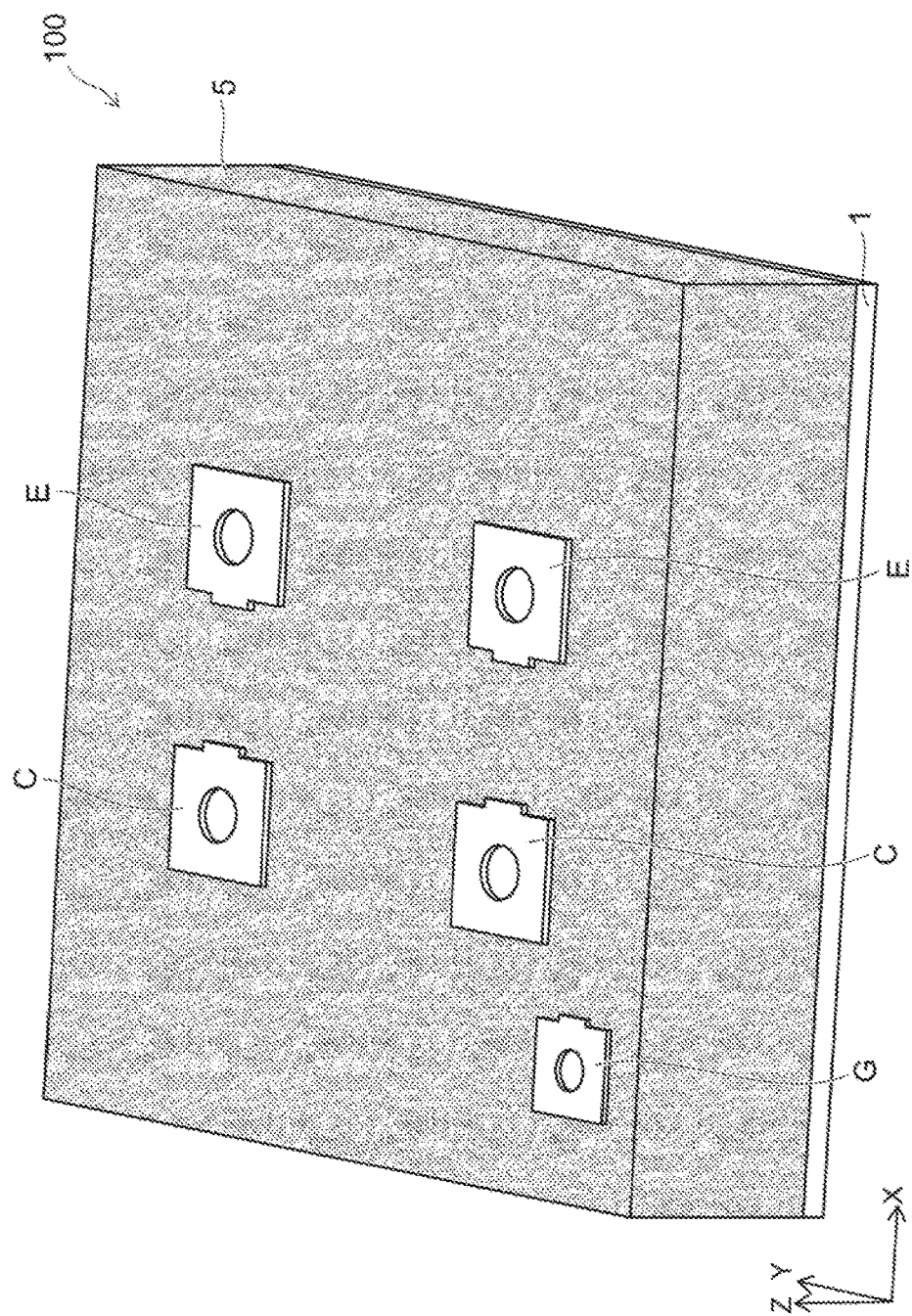
FIG. 1 is a perspective view of a semiconductor device according to a first embodiment.

In general, according to an embodiment, a semiconductor device comprises a first conductive layer having a first section and a second section separated from the first section in a first direction. A first semiconductor chip is on the first section and has a first electrode, a second electrode, and a third electrode. The first electrode is connected to and faces the first conductive layer. The second and third electrodes face away from the first conductive layer. A second semiconductor chip is on the second section and has a fourth electrode that is connected to and faces the first conductive layer, and a fifth electrode that face away from the first conductive layer. A second conductive layer is between the first and second sections of the first conductive layer in the first direction and is separated from the first conductive layer. The second conductive layer includes a first connected section to which the second electrode is connected, a second connected section to which to the fifth electrode is connected, and a first clearance portion between the first connected section and the second connected section in the first direction. A third conductive layer is spaced from the first conductive layer and the second conductive layer and is connected to the third electrode.

Hereinafter, description will be given of example embodiments by reference to drawings.

The drawings schematically and conceptually illustrate the example embodiments, and relationships between thicknesses, widths, or other dimensions of the respective components, ratios of sizes of the components, and the like are not necessarily the same as those in an actual device. The same component may be illustrated with different dimensions or ratios in different drawings.

The same reference numerals will be given to the same elements in different drawings or embodiments as those that have already been described, and detailed description will be omitted appropriately when elements are repeated in different drawings or embodiments.

For purposes of description of the various embodiments, an XYZ orthogonal coordinate system will be used. Here, two directions that are parallel to upper surfaces of a substrate 1 and each of the substrates 2 and mutually orthogonal are assumed to be an X direction (second direction) and a Y direction (first direction), and a direction that is orthogonal to both the X direction and the Y direction is assumed to be a Z direction.

First Embodiment

Description will be given of an example of a semiconductor device according to a first embodiment with reference to FIGS. 1 to 4A-4C.

Figure 2:
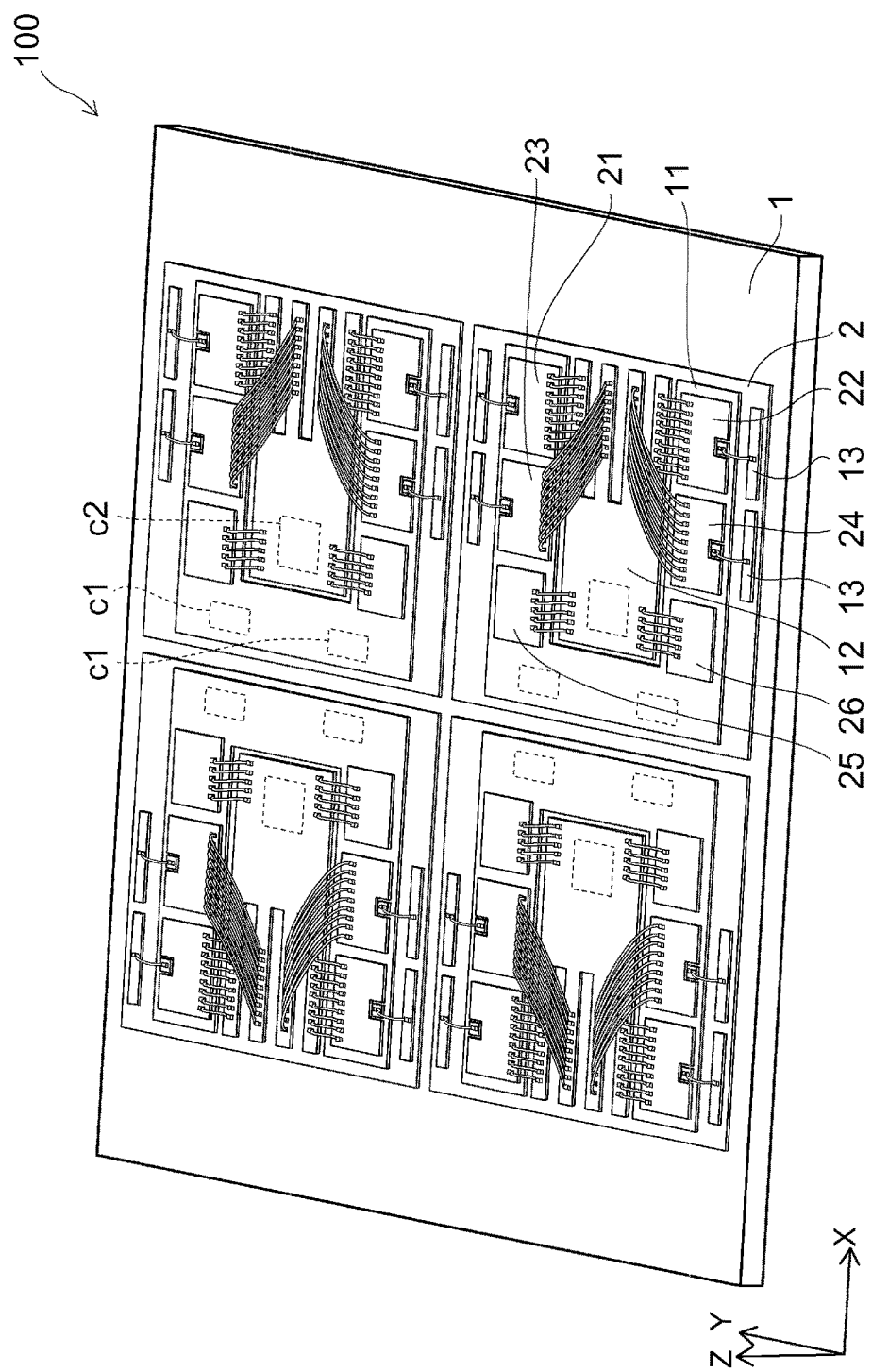
FIG. 2 is a perspective view of the semiconductor device according to the first embodiment.

FIGS. 1 and 2 are perspective views of a semiconductor device 100 according to the first embodiment.

Figure 3:
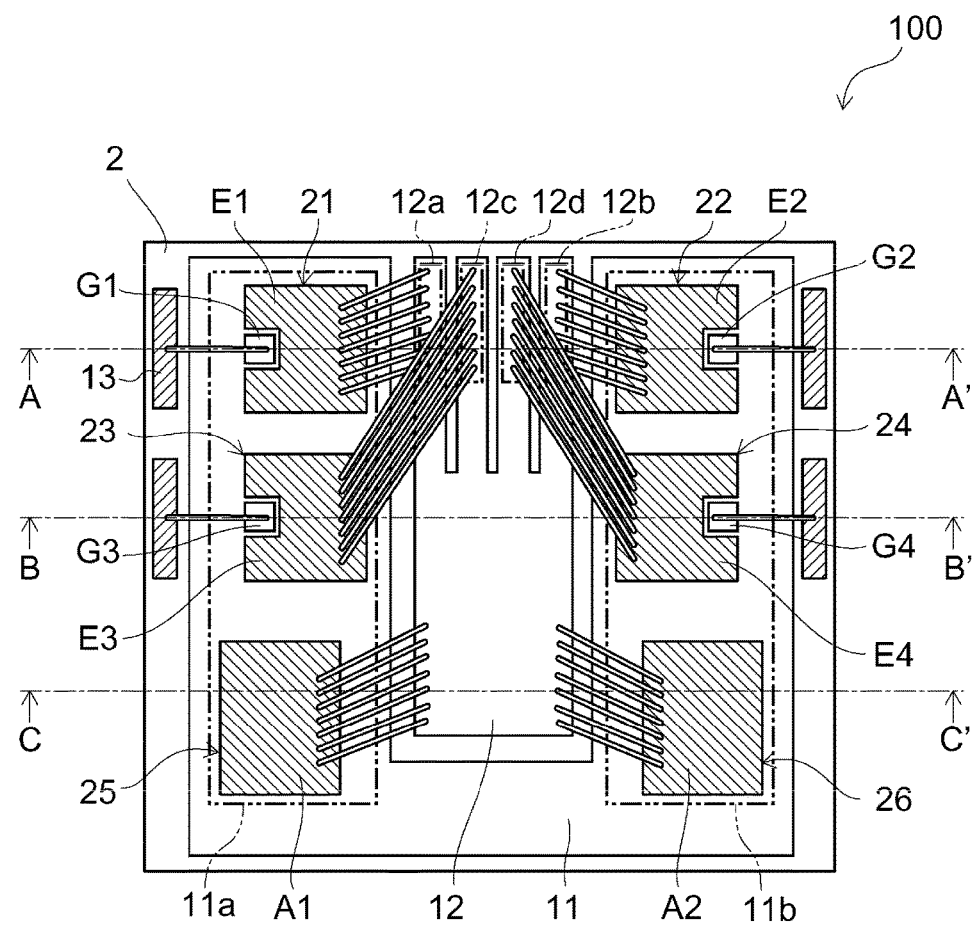
FIG. 3 is an enlarged plan view illustrating a part of the semiconductor device according to the first embodiment.
Figure 4:
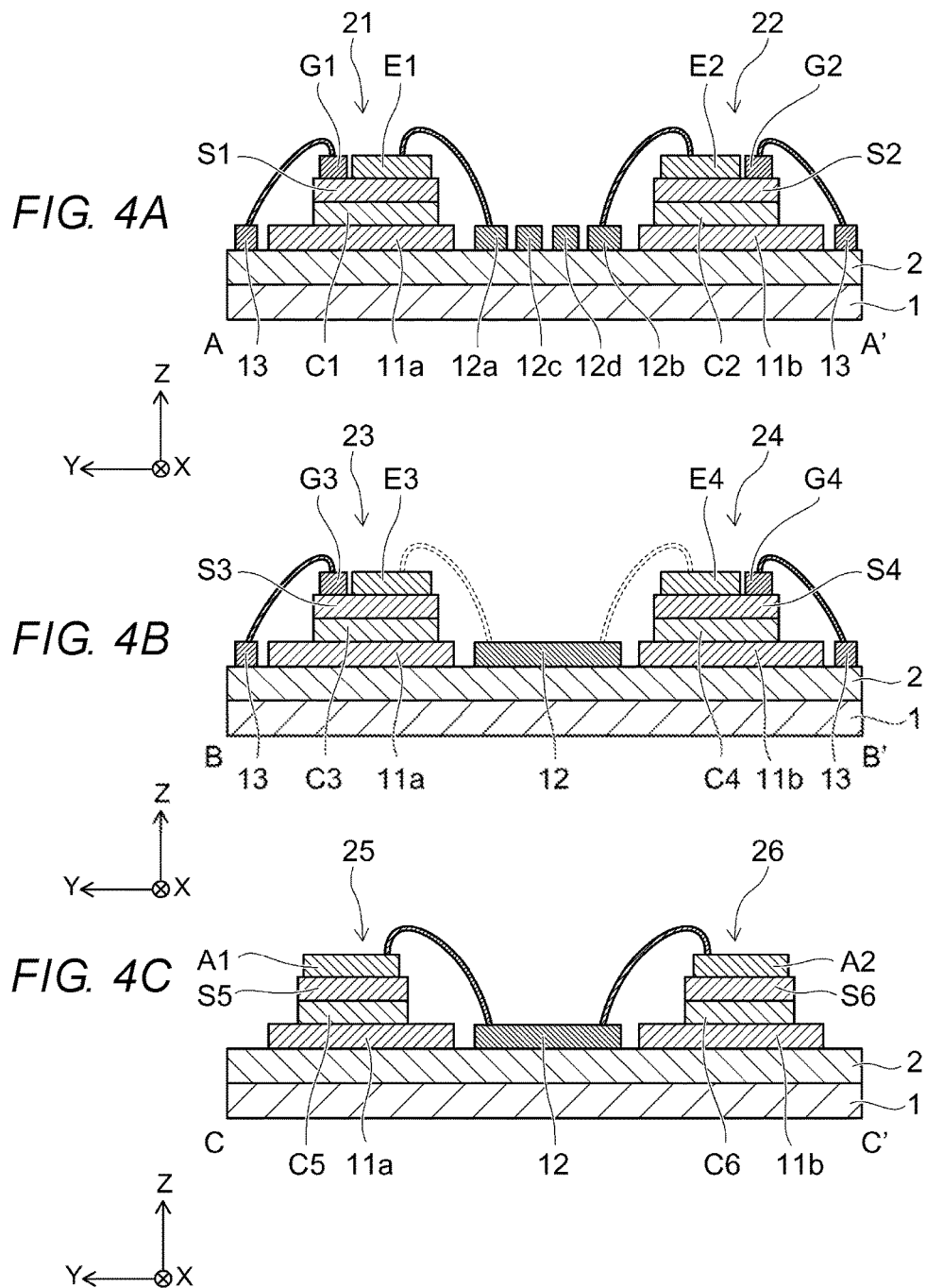
FIGS. 4A to 4C are a cross-sectional views of components depicted in FIG. 3.

FIG. 3 is an enlarged plan view illustrating a portion of the semiconductor device 100 according to the first embodiment.

FIG. 4A is a cross-sectional view taken along the line A-A' in FIG. 3, FIG. 4B is a cross-section view taken along the line B-B' in FIG. 3, and FIG. 4C is a cross-sectional view taken along the line C-C' in FIG. 3.

In FIG. 2, a sealing section 5, an emitter terminal E, a collector terminal C, and a gate terminal G are omitted from the depiction for purposes of explanation.

As illustrated, the semiconductor device 100 includes the substrate 1, multiple substrates 2, the sealing section 5, first conductive layers 11, second conductive layers 12, third conductive layers 13, a semiconductor chip 21 (first semiconductor chip), a semiconductor chip 22 (second semiconductor chip), a semiconductor chip 23 (third semiconductor chip), a semiconductor chip 24, a semiconductor chip 25 (fourth semiconductor chip), a semiconductor chip 26, emitter terminals E, collector terminals C, and a gate terminal G.

The semiconductor chips 21 to 24 are Insulated Gate Bipolar Transistors (IGBTs), for example.

The semiconductor chips 25 and 26 are Free Wheel Diodes (FWDs), for example.

As illustrated in FIG. 1, the sealing section 5 is provided on the first substrate 1 and seals other components provided on the first substrate 1. The sealing section 5 may be, for example, a resin packaging element. A portion of the emitter terminal E, a portion of the collector terminal C, a portion of the gate terminal G are provided above the sealing section 5 and are thus exposed to the outside. Holes are formed at tip ends of these respective terminals so as to allow connections to an external circuit.

As illustrated in FIG. 2, a plurality of substrates 2 is provided on the substrate 1 inside the sealing section 5. The substrates 2 are provided so as to be spaced away from each other. The first conductive layer 11, the second conductive layers 12, and the plurality of third conductive layer 13 are provided on each substrate 2. These conductive layers (11, 12, 13) may also be directly provided on the substrate 1 without a substrate 2 interposed therebetween in some embodiments.

The first conductive layer 11 is connected to the collector terminal C at a connected section c1. The second conductive layer 12 is connected to the emitter terminal E at a connected section c2. The third conductive layers 13 are connected to the gate terminal G via a wiring (which is not specifically shown in the drawing), or a printed circuit board substrate or the like.

The arrangement and shapes of the connected sections c1 and c2 can be appropriately changed as necessary.

As illustrated in FIG. 3, the first conductive layer 11 includes a first conductive section 11a and a second conductive section 11b. The first conductive section 11a and the second conductive section 11b are spaced from each other in the Y direction but can be connected to each other by other portions of the first conductive layer 11.

The semiconductor chips 21, 23, and 25 are provided, in this order, on the first conductive section 11a along the X direction.

The semiconductor chips 22, 24, and 26 are provided, in this order, on the second conductive section 11b along the X direction.

The second conductive layer 12 is provided between, in the Y direction, a portion of the first conductive section 11a and a portion of the second conductive section 11b. The semiconductor chips 21 and 22 face each other, the semiconductor chips 23 and 24 face each other, and the semiconductor chips 25 and 26 face each other with the second conductive layer 12 interposed between these facing chip pairs.

The distance between the semiconductor chips 21 and 22 in the Y direction is longer than the distance between the semiconductor chips 21 and 23 in the X direction, for example.

The second conductive layer 12 includes a connected section 12a (first connected section), a connected section 12b (second connected section), a connected section 12c (third connected section), and a connected section 12d. The connected sections 12a to 12d are spaced from each other in the Y direction, and clearances (e.g., slits) are formed between these connected sections.

As illustrated in FIG. 4A, the semiconductor chip 21 includes a semiconductor layer S1, a collector electrode C1 (first electrode), an emitter electrode E1 (second electrode), and a gate electrode G1 (third electrode). The semiconductor chip 22 includes a semiconductor layer S2, a collector electrode C2 (fourth electrode), an emitter electrode E2 (fifth electrode), and a gate electrode G2.

As illustrated in FIG. 4B, the semiconductor chip 23 includes a semiconductor layer S3, a collector electrode C3 (sixth electrode), an emitter electrode E3 (seventh electrode), and a gate electrode G3. The semiconductor chip 24 includes a semiconductor layer S4, a collector electrode C4, an emitter electrode E4, and a gate electrode G4.

As illustrated in FIG. 4C, the semiconductor chip 25 includes a semiconductor layer S5, a cathode electrode C5 (eighth electrode), and an anode electrode A5 (ninth electrode). The semiconductor chip 26 includes a semiconductor layer S6, a cathode electrode C6, and an anode electrode A6.

On each of the semiconductor chips 21 to 24, the emitter electrode and the gate electrode are provided on one side of the semiconductor layer, and the collector electrode is provided on the other side of the semiconductor layer. That is, for example, the gate and emitter electrodes are provided on an upper side of the semiconductor layer and the collector electrode is provided on an under side of the semiconductor layer.

On each of the semiconductor chips 25 and 26, an anode electrode is provided on one side of the semiconductor layer, and a cathode electrode is provided on the other side of the semiconductor layer.

The collector electrode C1, the collector electrode C3, and the anode electrode A5 are connected to the first conductive section 11a. The collector electrode C2, the collector electrode C4, and the anode electrode A6 are connected to the second conductive section 11b. These electrodes are connected to the first conductive layer 11 by using solder or conductive paste, for example.

The emitter electrode E1 is connected to the connected section 12a. The emitter electrode E2 is connected to the connected section 12b. The emitter electrode E3 is connected to the connected section 12c. The emitter electrode E4 is connected to the connected section 12d. The respective emitter electrodes and the respective connected sections are connected with a bonding wire. The anode electrodes A5 and A6 are connected with bonding wire to portions other than the connected sections 12a to 12d on the second conductive layer 12. The gate electrodes G1 to G4 are connected with bonding wire to the third conductive layers 13 provided in the vicinities of the respective semiconductor chips.

Here, description will be given of examples of materials which can be used for the respective components.

The substrate 1 can be a radiator plate made of a composite material including aluminum and ceramic, such as AlSiC (aluminum silicon carbide). Alternatively, the substrate 1 can be made of an insulating ceramic material, such as AlN (aluminum nitride), if the first to third conductive layers 11 to 13 are directly provided on the substrate 1.

The substrates 2 can be made of an insulating ceramic material such as AlN.

The sealing section 5 comprises an insulating resin, such as silicone resin.

The first conductive layer 11, the second conductive layer 12, and the third conductive layers 13 contain a metal material, such as copper or aluminum.

The semiconductor layers S1 to S6 included in the semiconductor chips 21 to 26 contain, as a main component, a semiconductor material such as silicon, silicon carbide, gallium nitride, or gallium arsenide.

The respective electrodes included in the semiconductor chips 21 to 26 contain a metal material, such as aluminum.

Next, description will be given of effects and possible advantages of the first embodiment with reference to FIG. 5.

Figure 5:
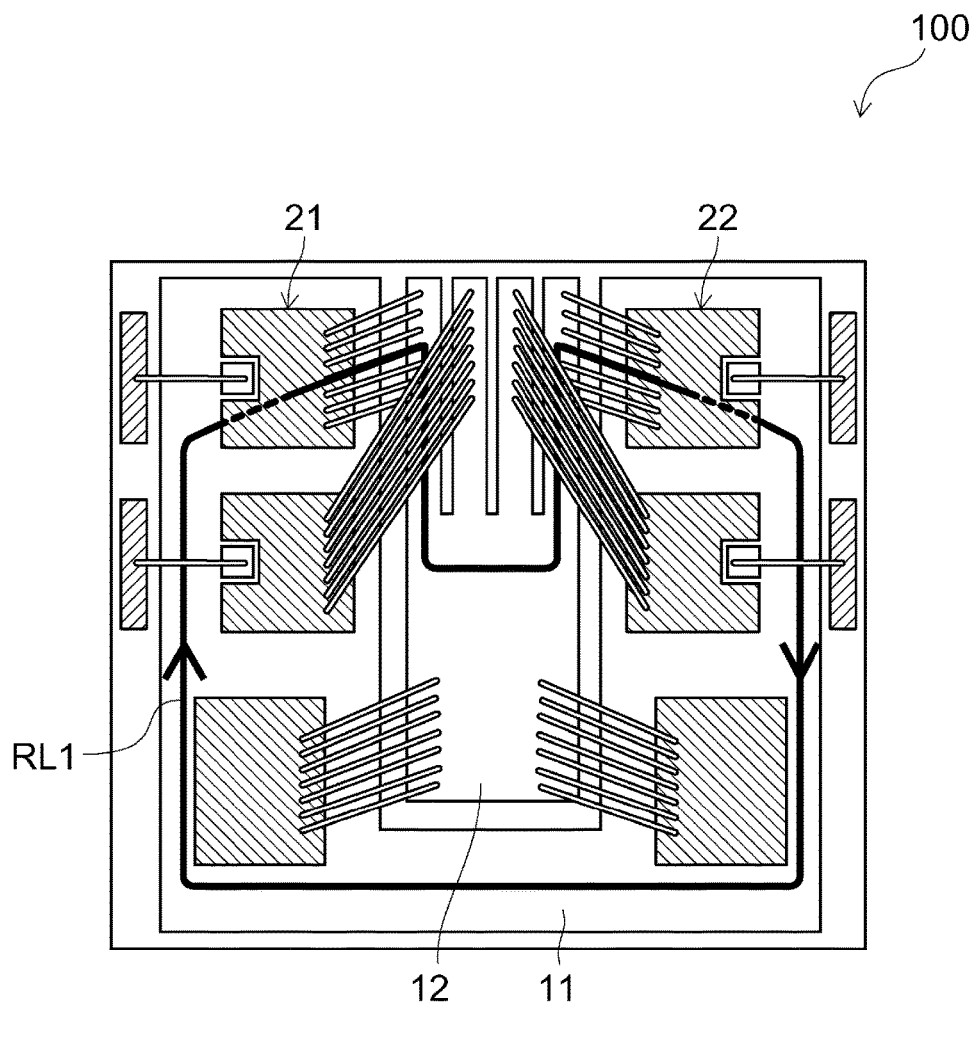
FIG. 5 is an enlarged plan view illustrating a portion of the semiconductor device according to the first embodiment.

FIG. 5 is an enlarged plan view illustrating a portion of the semiconductor device 100 according to the first embodiment.

In the semiconductor device 100, the first to third conductive layers 11 to 13 and the semiconductor chips 21 to 26 are provided on substrates 2, and an electric circuit is formed by connecting these components.

Here, resonance loops are also formed between these components. The resonance loops are closed circuits including semiconductor chips with a switching function. As an example of a resonance loop including the semiconductor chip 21, a resonance loop RL1 is illustrated in FIG. 5. The resonance loop RL1 is a loop that passes through the semiconductor chip 21, the second conductive layer 12, the semiconductor chip 22, and the first conductive layer 11. In addition, a plurality of resonance loops that pass through the semiconductor chip 21 and the respective semiconductor chips 23 to 26 are also present. That is, there are five resonance loops that pass through the semiconductor chip 21. Since the other semiconductor chips 22 to 24 also have a switching function, resonance loops are similarly formed between these semiconductor chips and the other semiconductor chips.

When the semiconductor chip is switched, noise occurs in a gate potential between the gate electrode and the emitter electrode. In the following description, the noise occurring in the gate potential between the gate electrode and the emitter electrode will be referred to as switching noise. If a frequency of the switching noise matches a resonance frequency of any of the resonance loops, the switching noise will be amplified.

The resonance frequency of any particular resonance loops depends on inductance and capacitance of the resonance loop. As the inductance and the capacitance decrease, the resonance frequency increases. The frequency of the switching noise depends on capacitance of the corresponding semiconductor chip.

Since capacitance of the semiconductor chip is typically large while inductance and capacitance of the resonance loops are typically small, the frequency band of the switching noise is usually lower than the resonance frequency, and matching of frequencies does not easily occur.

However, the voltage resistance required for semiconductor chips has increased with a decrease in the thickness of the semiconductor chip in recent years. If the voltage to be applied to the semiconductor device increases, the capacitance of the semiconductor chip decreases due to voltage dependency of the capacitance, and the frequency band of the switching noise also becomes higher. As a result, the matching of frequencies may more easily occur.

In terms of this point, the second conductive layer 12 includes a clearance (or several clearances) between the connected section 12a to which the emitter electrode E1 of the semiconductor chip 21 is connected and the connected section 12b to which the emitter electrode E2 of the semiconductor chip 22 is connected. By the second conductive layer 12 including the clearance (e.g., a slot) between the connected section 12a and the connected section 12b, it is possible to extend a loop path length between the connected section 12a and the connected section 12b. It is possible to increase inductance by extending the path length and to thereby reduce the resonance frequency. As a result, it is possible to reduce the resonance frequency bands of the resonance loops passing through the semiconductor chip 21 and the semiconductor chip 22 to a lower frequency band than the switching noise and to thereby reduce the possibility that the matching of frequencies occur.

Similarly, it is possible to reduce the resonance frequencies of the resonance loops including the semiconductor chips by forming clearances between the connected sections 12a to 12d to extend the path lengths between the semiconductor chips 21 to 24.

Second Embodiment

Description will be given of an example of a semiconductor device according to a second embodiment with reference to FIG. 6.

FIG. 6 is an enlarged plan view illustrating a portion of a semiconductor device 200 according to the second embodiment.

The semiconductor device 200 is different from the semiconductor device 100 in that a wiring 31 and a wiring 32 are further provided.

In the second embodiment, emitter electrodes E1 and E3 are short-circuited with the wiring 31. That is, the emitter electrodes E1 and E3 are connected to the same potential via a second conductive layer 12, and in the semiconductor device 200, these electrodes are also more directly short-circuited to each other by the wiring 31.

Similarly, the emitter electrodes E2 and E4 are directly short circuited to each other by the wiring 32.

Here, description will be given of effects and advantages of the second embodiment with reference to FIG. 7.

FIG. 7 is an enlarged plan view illustrating a portion of the semiconductor device 200 according to the second embodiment.

It is possible to increase capacitance of the resonance loops passing through any of the semiconductor chips 21 and and any of the semiconductor chips 22 and 24 by short-circuiting the emitter electrodes E1 and E3 to each other and short-circuiting the emitter electrodes E2 and E4 to each other. The capacitance of the semiconductor chip 23 is added to the capacitance of the semiconductor chip 21, and the capacitance of the semiconductor chip 24 is added to the capacitance of the semiconductor chip 22 for the resonance loop RL1 passing through the semiconductor chip 21, the second conductive layer 12, the semiconductor chip 22, and the first conductive layer 11 illustrated in FIG. 7, for example. Therefore, the capacitance of the resonance loop RL1 increases, and the resonance frequency can be lowered.

By short-circuiting the emitter electrodes E1 and E3 to each other for the resonance loop passing through the semiconductor chips 21 and 23 that are provided at a relatively short distance from each other, a resonance loop RL2 passing through the wiring 31 is also formed as depicted in FIG. 7. However, the path of the resonance loop RL2 is much shorter than the path of the resonance loop passing through the bonding wire(s) and the second conductive layer 12. That is, it is possible to greatly reduce the inductance of the resonance loop RL2 passing through the semiconductor chips 21 and 23 by short-circuiting the emitter electrodes E1 and E3.

In the case of reducing the inductance, the resonance frequencies of the resonance loops become high. However, the semiconductor chips 21 and 23 are located at mutually close positions, and it is possible to raise the resonance frequencies of the resonance loops to be beyond the frequency of the switching noise by short-circuiting the emitter electrodes of these semiconductor chips.

Similarly, it is possible to reduce the inductance of the resonance loops and raise the resonance frequencies by short-circuiting the emitter electrodes E2 and E4 for the resonance loops passing through the semiconductor chips 22 and 24.

That is, the resonance frequencies of the resonance loops are lowered below the frequency of the switching noise by increasing the capacitance for the resonance loops passing through the semiconductor chips that are distant from each other, such as the resonance loop RL1, and the possibility that the matching of the frequencies occurs is still reduced in the second embodiment. In contrast, the resonance frequencies of the resonance loops including the wires 31 or 32 are raised beyond the frequency of the switching noise by reducing inductance for those resonance loops passing through the semiconductor chips provided at mutually close positions, such as the resonance loop RL2, and the possibility that the matching of frequencies occurs is also reduced.

Therefore, it is possible to further reduce the possibility that the frequency of the switching noise matches the resonance frequencies in the second embodiment as compared with the first embodiment.

Third Embodiment

Description will be given of an example of a semiconductor device according to a third embodiment with reference to FIG. 8.

Figure 8:
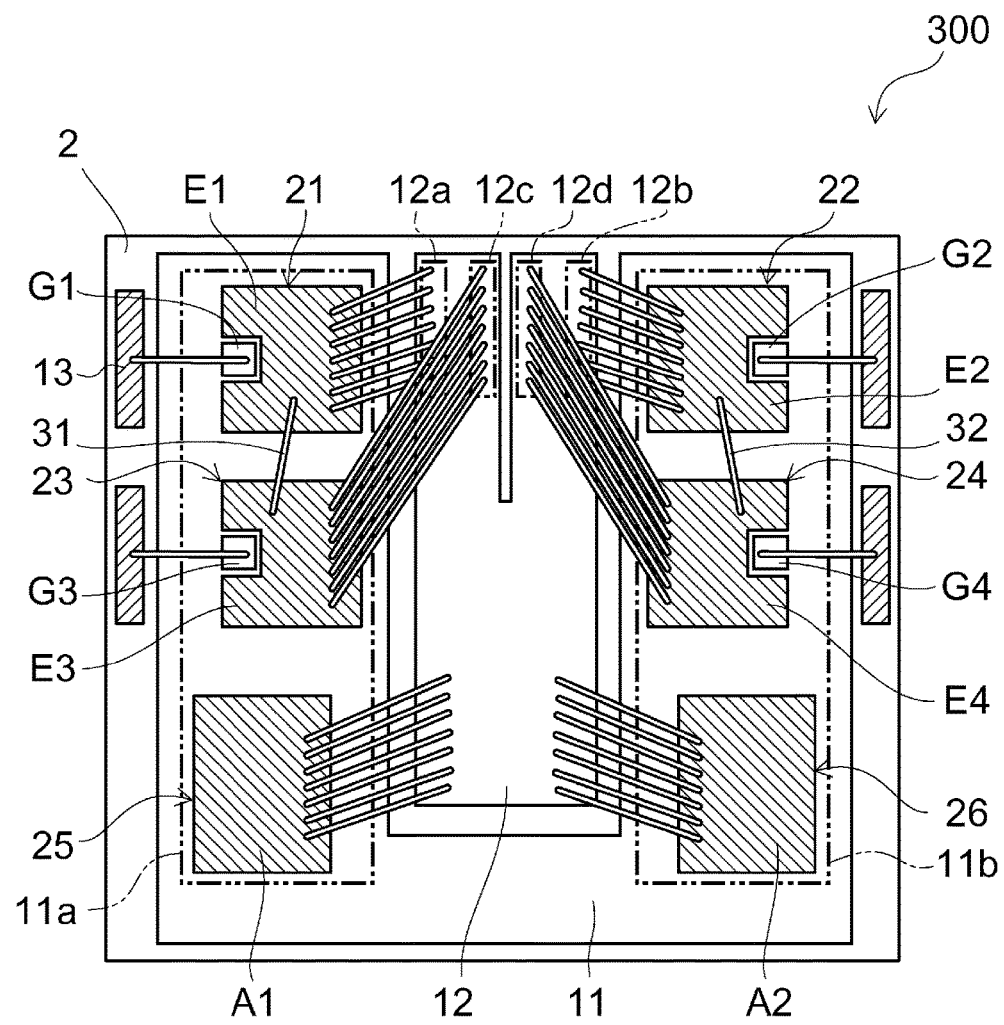
FIG. 8 is an enlarged plan view illustrating a portion of a semiconductor device according to a third embodiment.

FIG. 8 is an enlarged plan view illustrating a portion of a semiconductor device 300 according to the third embodiment.

The semiconductor device 300 is different from the semiconductor device 200 in the structure of the second conducive layer 12, for example.

The second conductive layer 12 includes connected sections 12a to 12d. However, in this instance, no clearance is formed between the connected section 12a and the connected section 12c or between the connected section 12b and the connected section 12d, unlike the semiconductor devices 100 and 200. With such a configuration, it is possible to reduce electric resistance to a current flowing from the semiconductor chips 21 to 24 to the second conductive layer 12 through the connected sections 12a to 12d and to thereby reduce power consumption of the semiconductor device. A clearance is thus formed only directly between the connected section 12c and 12d as depicted in FIG. 8.

That is, according to the third embodiment, it is possible to reduce the power consumption of the semiconductor device as compared with the second embodiment.

Fourth Embodiment

Description will be given of an example of a semiconductor device according to a fourth embodiment with reference to FIG. 9.

Figure 9:
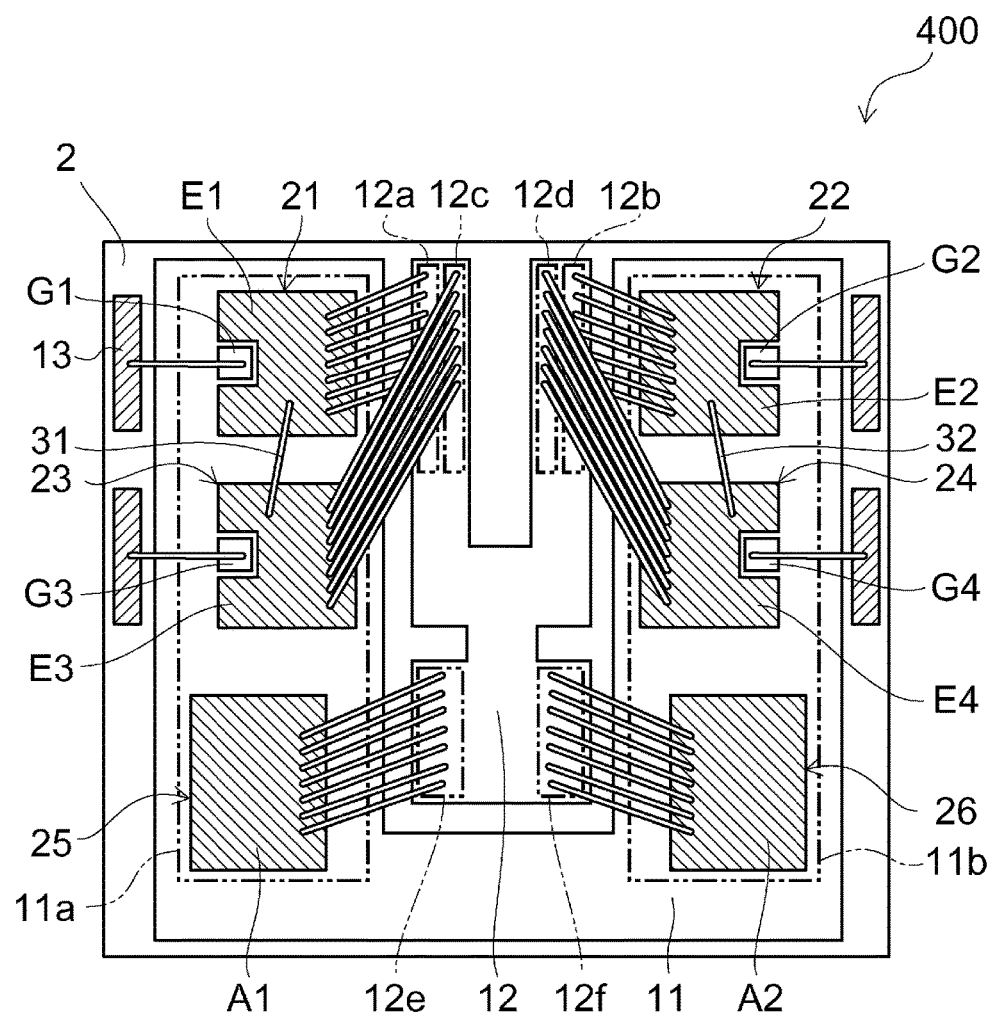
FIG. 9 is an enlarged plan view illustrating a portion of a semiconductor device according to a fourth embodiment.

FIG. 9 is an enlarged plan view illustrating a portion of a semiconductor device 400 according to a fourth embodiment.

The semiconductor device 400 is different from the semiconductor device 300 in the configuration of the second conductive layer 12, for example.

In the fourth embodiment, the second conductive layer 12 includes a clearance (slot or slots) between the connected section 12a and the connected section 12e (fourth connected section) to which the anode electrode A5 is connected. The second conductive layer 12 also similarly includes a clearance between the connected section 12b and the connected section 12f to which the anode electrode A6 is connected.

It is thus possible to increase the inductance of the resonance loops including any of the semiconductor chips 21 to 24 and any of the semiconductor chips 25 and 26 by the second conductive layer 12 by including such additional clearances. Therefore, according to the fourth embodiment, it is possible to reduce the resonance frequencies of these resonance loops and to further reduce the possibility that matching between the frequency of the switching noise and the resonance frequencies occurs as compared with the third embodiment. FIG. 9 also depicts a single clearance directly between connected section 12c and 12d as in third embodiment; however, the depicted clearance is wider than in the third embodiment. In general, the clearance width can be varied arbitrarily and the concept of fourth embodiment can also be used in conjunction with the first, second, or third embodiments.

Modification Example

Figure 10:
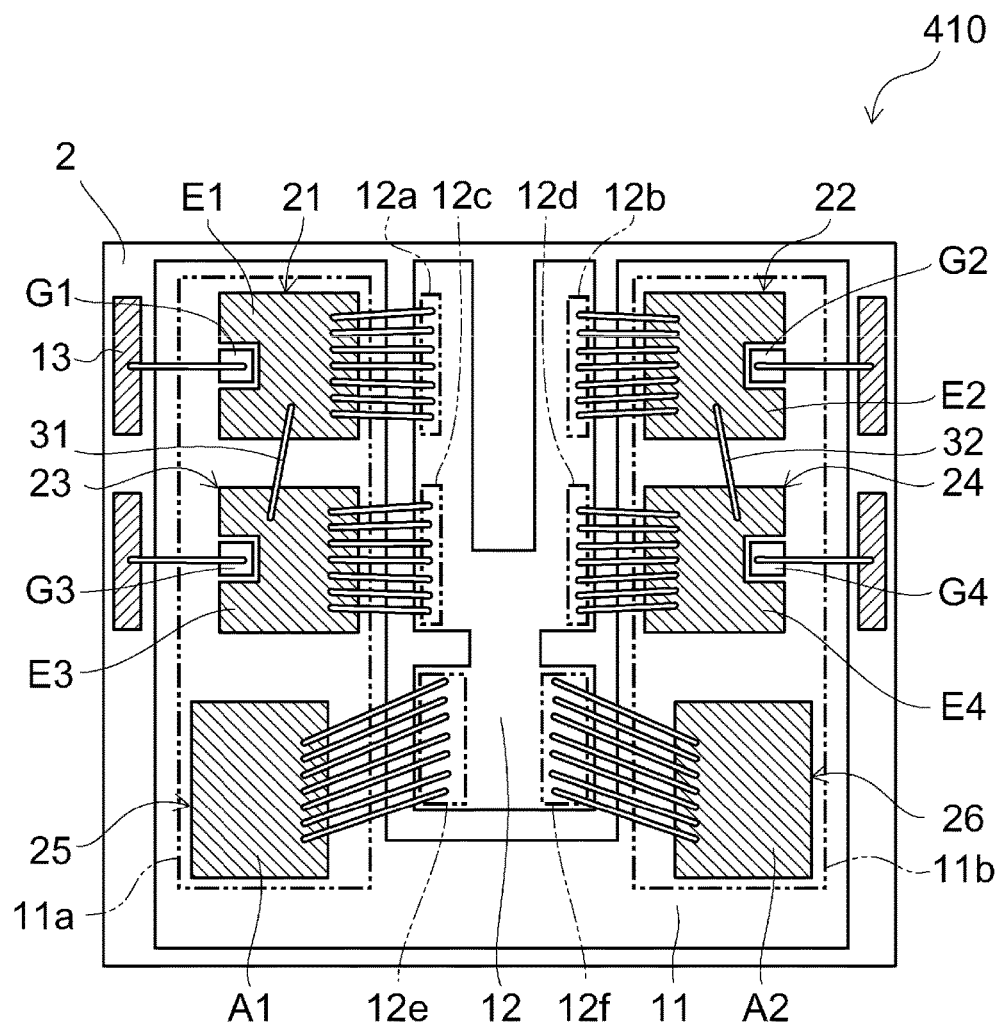
FIG. 10 is an enlarged plan view illustrating a portion of a semiconductor device according to a modification example of the fourth embodiment.

FIG. 10 is an enlarged plan view illustrating a portion of a semiconductor device 410 according to a modification example of the fourth embodiment.

In the semiconductor device 400, the bonding wire connected to the emitter electrodes E3 and E4 is connected to positions distant from the emitter electrodes E3 and E4. In contrast, the bonding wire connected to the emitter electrodes E3 and E4 is connected close to these emitter electrodes in the semiconductor device 410. That is, the semiconductor chips 21 and 23 are aligned in the X direction, and the connected sections 12a and 12c are also aligned in the X direction. In addition, the connected section 12 is positioned between the connected sections 12a and 12e in the X direction.

Similarly, the connected sections 12b and 12d are also aligned in the X direction and are positioned between the connected sections 12b and 12f in the X direction.

Since the bonding wire connected to the emitter electrodes E3 and E4 is connected close to these emitter electrodes in this modification example, it is possible to shorten the length of the bonding wire. Therefore, it is possible to reduce electric resistance when a current flows through the bonding wire and to reduce power consumption of the semiconductor device.

In the semiconductor device 410, the distance between the connected section 12c and the connected section 12e is shorter than that in the semiconductor device 400, for example. However, since the second conductive layer 12 includes the clearance between the connected section 12c and the connected section 12e, it is still possible to suppress amplification of the resonance frequencies of the resonance loops passing through the semiconductor chips 23 and 25.

That is, according to the modification example, it is possible to suppress amplification of the resonance frequencies of the resonance loops and to reduce the power consumption of the semiconductor device as compared with the semiconductor device 400.

Although the case in which the semiconductor chips 21 to 24 are IGBTs has been described in the above example, the semiconductor chips 21 to 24 may instead be Metal Oxide Semiconductor Field Effect Transistors (MOSFET). Alternatively, some semiconductor chips 21 to 24 may be a mix of MOSFETs and IGBTs, and the other semiconductor chips may be diodes. The above embodiments are effective if a semiconductor device includes at least one semiconductor chip with a switching function and resonance loops will be formed.

Although the case in which the six semiconductor chips 21 to 26 are provided on the first conductive layer 11 has been described, the number of semiconductor chips provided on the first conductive layer 11 may be arbitrarily set to different numbers. The position and the shape of the clearance or clearances in the second conductive layer 12 can be appropriately varied in accordance with the number of semiconductor chips connected.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. For example, the specific configurations of the respective elements such as the substrate 1, the substrates 2, the sealing section 5, the first conductive layers 11, the second conductive layers 12, the third conductive layers 13, the semiconductor chips 21 to 26, the emitter terminals E, the collector terminals C, and the gate terminals G can be appropriately selected or varied by those skilled in the art according to known technologies. The accompanying claims and their equivalents are intended to cover such forms or modifications as would fall within the scope and spirit of the inventions.

What is claimed is:

1. A semiconductor device, comprising:
    a first conductive layer having a first section and a second section separated from the first section in a first direction;
    a first semiconductor chip on the first section and including a first electrode, a second electrode, and a third electrode, the first electrode connected to and facing the first conductive layer, the second and third electrodes facing away from the first conductive layer;
    a second semiconductor chip on the second section and including a fourth electrode connected to and facing the first conductive layer and a fifth electrode facing away from the first conductive layer;
    a second conductive layer between the first and second sections of the first conductive layer in the first direction and separated from the first conductive layer, the second conductive layer including a first connected section to which the second electrode is connected, a second connected section to which the fifth electrode is connected, and a first clearance portion between the first connected section and the second connected section in the first direction; and
    a third conductive layer spaced from the first conductive layer and the second conductive layer and connected to the third electrode.

2. The semiconductor device according to claim 1, wherein
    the first connected section is connected to the second electrode with a first bonding wire, and
    the second connected section is connected to the fifth electrode with a second bonding wire.

3. The semiconductor device according to claim 1, wherein the first semiconductor chip is soldered to the first conductive layer.

4. The semiconductor device according to claim 1, wherein the first semiconductor chip includes a switching element which changes an electrical conductance state between the first and second electrodes.

5. The semiconductor device according to claim 1, further comprising:
    a substrate on which the first, second, and third conductive layers are directly disposed.

6. The semiconductor device according to claim 5, further comprising:
    a radiator plate on which the substrate is disposed.

7. The semiconductor device according to claim 1, further comprising:
    a third semiconductor chip on the first section of the first conductive layer and aligned with the first semiconductor chip along a second direction that intersects the first direction, and including a sixth electrode connected to and facing the first conductive layer and a seventh electrode facing away from the first conductive layer, wherein
    the second conductive layer further includes a third connected section to which the seventh electrode is connected, and
    the third connected section is between the first connected section and the second connected section in the first direction.

8. The semiconductor device according to claim 7, wherein
    the second conductive layer includes a second clearance portion between the first connected section and the third connected section, and
    the first clearance portion is between the second connected section and the third connected section.

9. The semiconductor device according to claim 8, wherein the second electrode and the seventh electrode are directly short-circuited to each other.

10. The semiconductor device according to claim 7, wherein the second electrode and the seventh electrode are directly short-circuited to each other.

11. The semiconductor device according to claim 10, wherein a bonding wire is directly connected at a first end to the second electrode and at a second end to the seventh electrode.

12. The semiconductor device according to claim 7, further comprising:
    a fourth semiconductor chip on the first section of the first conductive layer and separated from the first and third semiconductor chips and including an eighth electrode connected to and facing the first conductive layer and a ninth electrode facing away from the first conductive layer, wherein
    the third semiconductor chip is between the first semiconductor chip and the fourth semiconductor chip along the second direction,
    the second conductive layer further includes a fourth connected section to which the ninth electrode is connected, the fourth connected section being spaced from the first connected section in the second direction, and
    the second conductive layer includes a second clearance portion between the first connected section and the fourth connected section.

13. The semiconductor device according to claim 1, wherein the first clearance portion is a slot formed in the second conductive layer extending from a first outer edge of the second conductive layer to an interior portion of the second conductive layer such that a conductance path from the first connected portion to the second connected portion is not direct along the first direction from the first connected portion to the second connected portion.

14. A semiconductor device, comprising:
    a first substrate;
    a second substrate on the first substrate;
    a first conductive layer on a surface of the second substrate and having a first section and a second section separated from the first section in a first direction parallel to the surface of the second substrate;
    a first semiconductor chip on the first section and including a first electrode, a second electrode, and a third electrode, the first electrode connected to and facing the first conductive layer, the second and third electrodes facing away from the first conductive layer;

a second semiconductor chip on the second section and including a fourth electrode connected to and facing the first conductive layer and a fifth electrode facing away from the first conductive layer;

a second conductive layer between the first and second sections of the first conductive layer in the first direction and separated from the first conductive layer, the second conductive layer including a first connected section to which the second electrode is connected, a second connected section to which to the fifth electrode is connected, and a first clearance portion between the first connected section and the second connected section in the first direction; and a third conductive layer spaced from the first conductive layer and the second conductive layer and connected to the third electrode.

15. The device according to claim 14, further comprising:

a plurality of second substrates on the first substrate spaced from each other;

a sealing section to cover the plurality of second substrates;

a first external electrode extending from the sealing section and electrically connected to the first conductive layer;

a second external electrode extending from the sealing section and electrically connected to the second conductive layer; and a third external electrode extending from the sealing section and electrically connected to the third conductive layer.

16. The device according to claim 14, wherein the first semiconductor chip is an insulated gate bipolar transistor device.

17. A semiconductor device, comprising:

a first semiconductor chip mounted on a first section of a first conductive layer and having a switching function that changes a conductance state between a first electrode connected to the first conductive layer and a second electrode facing away from the first conductive layer according to a control signal supplied to a third electrode of the first semiconductor chip;

a second semiconductor chip mounted on a second section of the first conductive layer spaced from the first section in a first direction and including a fourth electrode connected to the first conductive layer and a fifth electrode facing away from the first conductive layer; and a second conductive layer between the first and second sections of the first conductive layer in the first direction and separated from the first conductive layer, the second conductive layer including a first connected section to which the second electrode is connected by a bonding wire, a second connected section to which to the fifth electrode is connected by a bonding wire, and a first clearance portion between the first connected section and the second connected section in the first direction.

18. The semiconductor device according to claim 17, further comprising:

a third semiconductor chip on the first section of the first conductive layer and aligned with the first semiconductor chip along a second direction that intersects the first direction, and including a sixth electrode connected to and facing the first conductive layer and a seventh electrode facing away from the first conductive layer, wherein the second conductive layer further includes a third connected section to which the seventh electrode is connected by a bonding wire, and the third connected section is between the first connected section and the second connected section in the first direction.

19. The semiconductor device according to claim 18, wherein the second and seventh electrodes are directly connected to each other with a bonding wire.

20. The semiconductor device according to claim 18, wherein the second conductive layer further includes a second clearance portion between the second and third connected sections, and the first clearance portion is between the first and third connected portions.

* * * * *